United States Patent [19]

Grace et al.

[11] Patent Number: 5,113,094
[45] Date of Patent: May 12, 1992

[54] METHOD AND APPARATUS FOR INCREASING THE HIGH FREQUENCY SENSITIVITY RESPONSE OF A SAMPLER FREQUENCY CONVERTER

[75] Inventors: Martin I. Grace, San Jose; Peter M. Kapetanic, Morgan Hill; Eric C. Liu, Milpitas, all of Calif.

[73] Assignee: Wiltron Company, Morgan Hill, Calif.

[21] Appl. No.: 492,763

[22] Filed: Mar. 13, 1990

[51] Int. Cl.⁵ .................. G06G 7/00; H03B 19/00
[52] U.S. Cl. .......................... 307/529; 307/271; 307/219.1; 328/15; 328/16; 333/218
[58] Field of Search .......... 307/296.1, 219.1, 271, 307/522, 523, 529, 320, 317.1; 328/15, 16, 18, 160; 333/218; 332/9 T

[56] References Cited

U.S. PATENT DOCUMENTS

| | | | |
|---|---|---|---|
| 3,376,495 | 4/1968 | Leonard | 333/218 |
| 3,397,369 | 8/1968 | Uhlir, Jr. et al. | 328/16 |
| 3,829,797 | 8/1974 | Karkar et al. | 307/529 |
| 4,504,791 | 3/1985 | Conway et al. | 328/15 |
| 4,513,250 | 4/1985 | Harman | 333/218 |
| 4,638,180 | 1/1987 | Sagawa et al. | 328/16 |

*Primary Examiner*—Stanley D. Miller
*Assistant Examiner*—Richard Roseen
*Attorney, Agent, or Firm*—Fliesler, Dubb, Meyer & Lovejoy

[57] ABSTRACT

A method and apparatus comprising a sampler frequency converter having a first and a second diode. A local oscillator having a frequency $F_{LO}$, a step recovery diode and a balun transformer are used for providing positive and negative sampling pulses to the diodes for sampling an input signal applied to the diodes having a frequency $F_{IN}$. An output signal is provided by the diodes having a frequency $F_{OUT}$ which is defined by the relationship $F_{OUT}|F_{IN} \pm N \times F_{LO}|$ where N is an integer harmonic number 1, 2, 3 ... and the output signal has an amplitude which varies as a function of $(\sin x)/x$ where $x = F_{IN}$. A bandpass filter is provided which is responsive to the output signal for filtering a predetermined band of frequencies therefrom and a bias circuit is provided for forward biasing the diodes so that the frequency $F_{IN}$ of said input signal at which nulls occur in said $(\sin x)/x$ relationship occur at a lower frequency after said biasing than before said biasing.

14 Claims, 4 Drawing Sheets

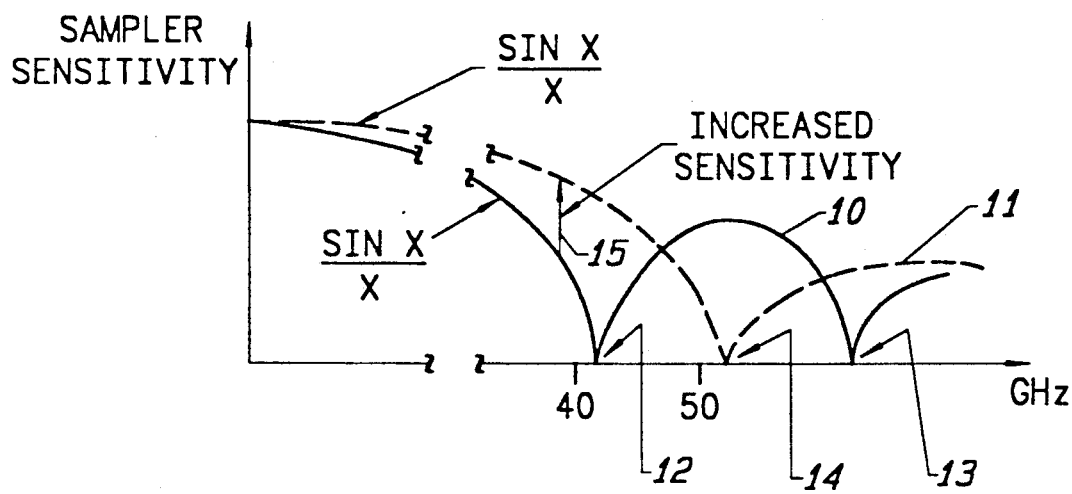
FIG. 2
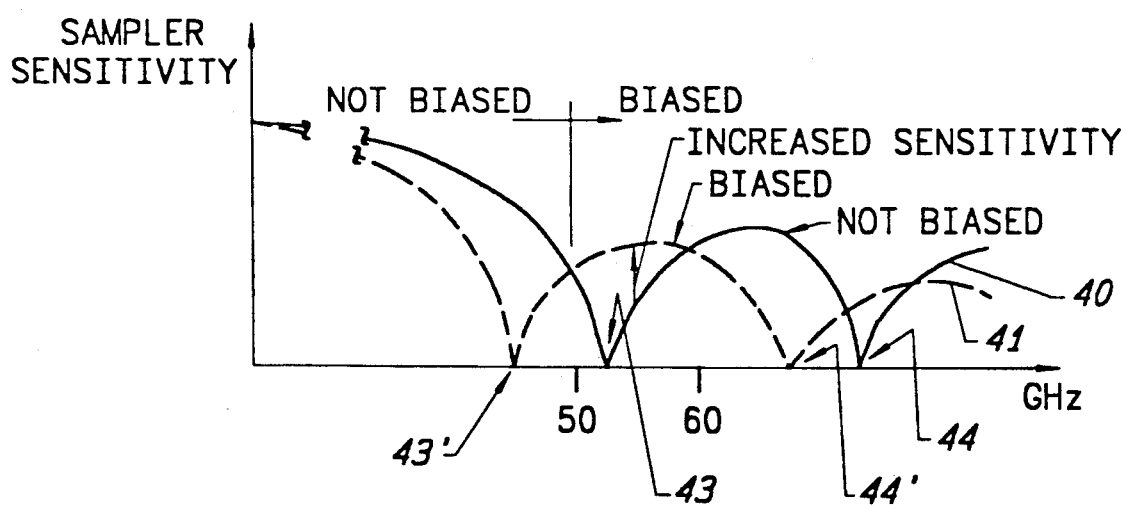
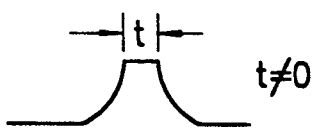
FIG. 8
FIG. 7
FIG. 9

5,113,094

METHOD AND APPARATUS FOR INCREASING THE HIGH FREQUENCY SENSITIVITY RESPONSE OF A SAMPLER FREQUENCY CONVERTER

BACKGROUND OF THE INVENTION

1. Field of the Invention

The present invention is related to sampler frequency converter circuits in general and in particular to a method and apparatus for increasing the frequency range. i.e. high frequency sensitivity response, of a sampler frequency converter in a vector network analyzer.

2. Description of the Prior Art

A vector network analyzer (VNA) is an analytical instrument used for measuring the electrical characteristics of a device-under-test (DUT). The VNA typically comprises a signal generator for generating test signals and a sampler frequency converter for sampling and down-converting the test signals which are transmitted through and/or reflected from the DUT.

A conventional sampler frequency converter comprises a sampling circuit having an input and an output, a step recovery diode (SRD) which provides pulses for controlling the sampling period of the sampling circuit, a local oscillator having a frequency $F_{LO}$ for driving the SRD and a filter.

In operation, reflected or transmitted input signals $S_{IN}$ having the frequency $F_{IN}$ received from a DUT are applied to the input of the sampling circuit. The local oscillator signals having the frequency $F_{LO}$ are applied to the SRD. In response thereto the SRD outputs pulses, i.e. sampling pulses, having a pulse repetition rate equal to the frequency of the output of the oscillator. These SRD sampling pulses are used to control the conduction period and the sampling rate of the sampling circuit. That is to say, the rate at which the sampling circuit samples the input signal $S_{IN}$ depends on the cycle time of the SRD sampling pulses and the period of each sample depends on the period of SRD sampling pulses.

A Fourier analysis of the sampling pulses from the SRD reveals that in the frequency domain the sampling pulses comprise a plurality of uniformly spaced spectral lines having a spacing corresponding to the pulse repetition rate of the pulses.

As the SRD sampling pulses sample the input signal $S_{IN}$, the signal $S_{IN}$ having a frequency $F_{IN}$ is mixed with the spectral lines of the SRD pulses, producing an output signal $S_{OUT}$ having a frequency $F_{OUT}$ defined by the equation:

$$F_{OUT} = |F_{IN} \pm N \cdot F_{LO}| \qquad (1)$$

where

N is the harmonic number 1, 2, 3 ... For example, if the input signal $S_{IN}$ has a frequency $F_{IN} = 1089$ MHz and $F_{LO} = 500$ MHz, $$F_{OUT} = |1089 \pm 500| + |1089 \pm 1000| + |1089 \pm 1500| \ldots$$

The bandpass filter described above is coupled to the output of the sampling circuit to pass a selected one of the spectral lines from $S_{OUT}$. For example, if $F_{IN} = 1089$ MHz, $F_{LO} = 500$ MHz and the center frequency of the filter is 89 MHz, the 2nd harmonic of the output of the SRD at 1000 MHz will produce an 89 MHz signal on the output of the filter. Similarly, if $F_{IN} = 59.589$ GHz, the output of the filter will be produced in response to the 119th harmonic at 59 GHz.

In a sampler frequency converter as described above, as the frequency $F_{IN}$ of the input signal $S_{IN}$ is changed, the frequency $F_{LO}$ of the local oscillator is also changed so that the output of the filter remains centered at the center frequency of the bandpass filter. In addition, however, as the frequency $F_{IN}$ is increased, the insertion loss of the sampling circuit increases and thus, the amplitude of the output $S_{OUT}$ of the sampling circuit generally decreases according to the relationship (sin x)/x, where $x = F_{IN}$, the frequency of the input signal $S_{IN}$.

Heretofore, to increase the sampler frequency response of a given sampler as the frequency $F_{IN}$ of the input signal $S_{IN}$ was increased, it was the practice to reduce the sampler conduction period, i.e. sampling period. In practice, this was normally done by generating narrower SRD sampling pulses which had the net effect of moving the (sin x)/x response nulls higher in frequency. This practice, however, had the disadvantage that as the conduction duty cycle of the sampler was decreased, its output impedance was increased. Moreover, due to parasitic capacitance and other circuit limitations, further reductions in sampler conduction duty cycle were difficult to achieve in a practical circuit.

SUMMARY OF THE INVENTION

In view of the foregoing, principal objects of the present invention are a method and apparatus for extending the high frequency sensitivity response of a sampler frequency converter beyond that which is obtained using prior known methods and apparatus.

In accordance with the above objects there is provided a method and apparatus for selectively increasing the conduction duty cycle of the sampler in such a way that, in contrast to prior known methods and apparatus for extending sampler sensitivity to higher frequencies, the (sin x)/x nulls are moved, not higher, but lower in frequency.

In a preferred embodiment of the present invention, the increased conduction duty cycle is achieved by biasing diodes in the sampler at a predetermined input frequency $F_{IN}$. The input frequency $F_{IN}$ at which the bias is applied is that L frequency $F_{IN}$ at which the amplitude of the first or fundamental lobe of the (sin x)/x response falls to a level which is a predetermined fraction of the amplitude of the next adjacent lobe. For example, if the amplitude of the first lobe of the (sin x)/x response falls to 75% of the maximum amplitude of the 2nd or next adjacent lobe, the biasing of the sampler diodes will shift the (sin x)/x nulls lower in frequency such that at higher test signal frequencies, e.g. above 50 GHz, the amplitude of the output of the sampler will correspond to the 2nd lobe of the (sin x)/x response.

In addition to extending the high frequency sensitivity of a sampler, the present invention is also useful for preventing spurious sub-harmonic locks in a VNA which uses frequency multipliers in a phase-locked loop for generating the high frequency test signals. For example, in a system which uses a frequency tripler, a Fourier analysis shows that spectral lines exist at one-third and two-thirds of the fundamental frequency of the phase-locked loop and that the amplitude of these sub-harmonic lines can be high enough to cause false locks. To prevent this, a high pass filter is normally used to filter out the lower sub-harmonic frequency, e.g. below 40 GHz, and a shifting of the (sin x)/x nulls to the intermediate sub-harmonic frequency can reduce the amplitude of the spectral lines at that frequency so that the system will always lock on at the higher fundamental frequency.

BRIEF DESCRIPTION OF THE DRAWINGS

The above and other objects, features and advantages of the present invention will become apparent from the following detailed description of the accompanying drawings, in which:

FIG. 2 is a diagram of the increased sensitivity obtained by reducing the period of the sampling pulses from the SRD in the apparatus of FIG. 1;

FIGS. 7 and 8 are diagrams of the effective period of the pulses applied to the diodes of the apparatus of FIG. 3 before and after bias is applied, respectively;

FIG. 9 is a diagram showing the increased sensitivity obtained by biasing the diodes in the apparatus of FIG. 3 according to the present invention;

DETAILED DESCRIPTION OF THE INVENTION

Figure 1:
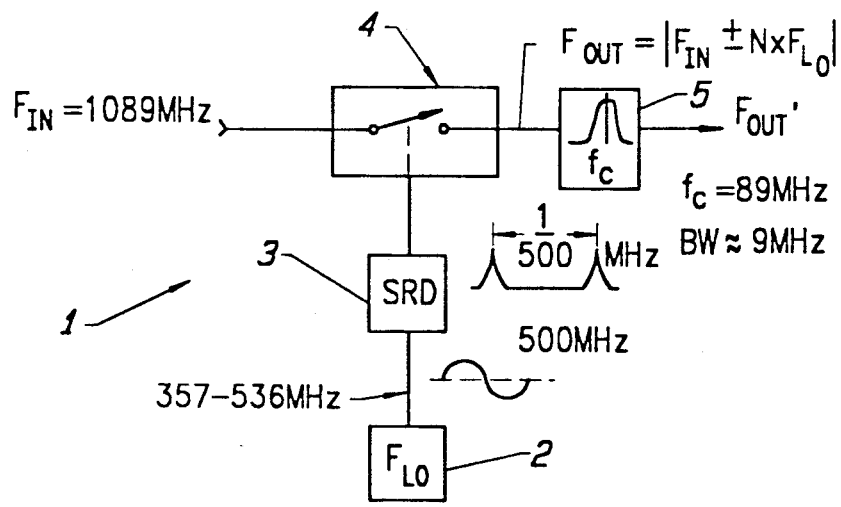
FIG. 1 is a generalized block diagram of a prior art sampler frequency converter.

Referring to FIG. 1, there is shown for use in a VNA a generalized block diagram of a prior art sampler frequency converter designated generally as 1. In the converter 1 there is provided a local oscillator 2. Local oscillator 2 provides an output signal having a frequency $F_{LO}$ within a predetermined frequency range of, for example, 357 MHz to 536 MHz. The frequency range given is not to be considered restricted to that range but in practice, the ratio of the high frequency to the low frequency is generally kept to within 1.5.

The output of the oscillator 2 is coupled to a step recovery diode (SRD) 3. SRD 3 provides a pulse train of sampling pulses having a cycle time corresponding to the frequency of the output of the oscillator 2. For example, if the oscillator 2 output is 500 MHz, the cycle time of the pulses at the output of the SRD 3 is 1/500 MHz.

The SRD 3 is coupled to a sampling circuit represented by a switch 4 for controlling the switch. Coupled to the output of the switch 4 there is provided a bandpass filter 5. The filter 5 may have, for example, a center frequency of 89 MHz and a bandwidth of about 9 MHz.

In operation, the sampler frequency converter 1 receives an input signal $S_{IN}$ having a frequency $F_{IN}$ from a DUT. The switch 4 in response to the output of the SRD 3 samples the input signal $S_{IN}$ and provides on its output an output signal $S_{OUT}$ having a frequency $F_{OUT} = |F_{IN} \pm N \times F_{LO}|$ where N is the harmonic number of the spectral lines in the output of the SRD 3. In response to the signal $S_{OUT}$ at the output of the switch 4, the filter 5 provides an output signal having a frequency $F_{OUT}'$ which comprises the signal at the filter center frequency $F_C$, e.g. 89 MHz.

In practice, the frequency $F_{IN}$ of the input signal to the switch 4 extends over a wide range of frequencies, such as for example, 10 MHz to 50 GHz. As the frequency $F_{IN}$ is increased, however, the amplitude of the output of the switch 4 varies as a function of the relationship (sin x)/x where $x = F_{IN}$.

Referring to FIG. 2, there is shown a curve 10 (solid line) and a curve 11 (broken line) which represent the output of the switch 4 for two different widths of the output pulses of the SRD 3.

As described above, as the frequency $F_{IN}$ increases, the amplitude of the output of the switch 4 varies as a function of (sin x)/x, such that the amplitude decreases sharply in the neighborhood of 40–50 GHz, as shown by the solid line 10, producing a null or minimum amplitude at 12 and at 13. To increase the frequency response, that is, the sampler sensitivity, the practice heretofore has been to reduce the duty cycle of the switch 4 by reducing the period of the output pulses from the SRD 3. When this is done, the nulls 12 and 13 are moved to a higher frequency. For example, the null 12 is moved to above 50 GHz as shown by the null 14 of the curve 11. The increased sensitivity is shown by the vertical arrow 15 located between the curves 10 and 11. As discussed above, however, the ability to further reduce the period of the pulses generated by the SRD 3 is limited, as is the ability of the switch 4 to respond thereto due to parasitic capacitance and other circuit limitations.

Figure 3:
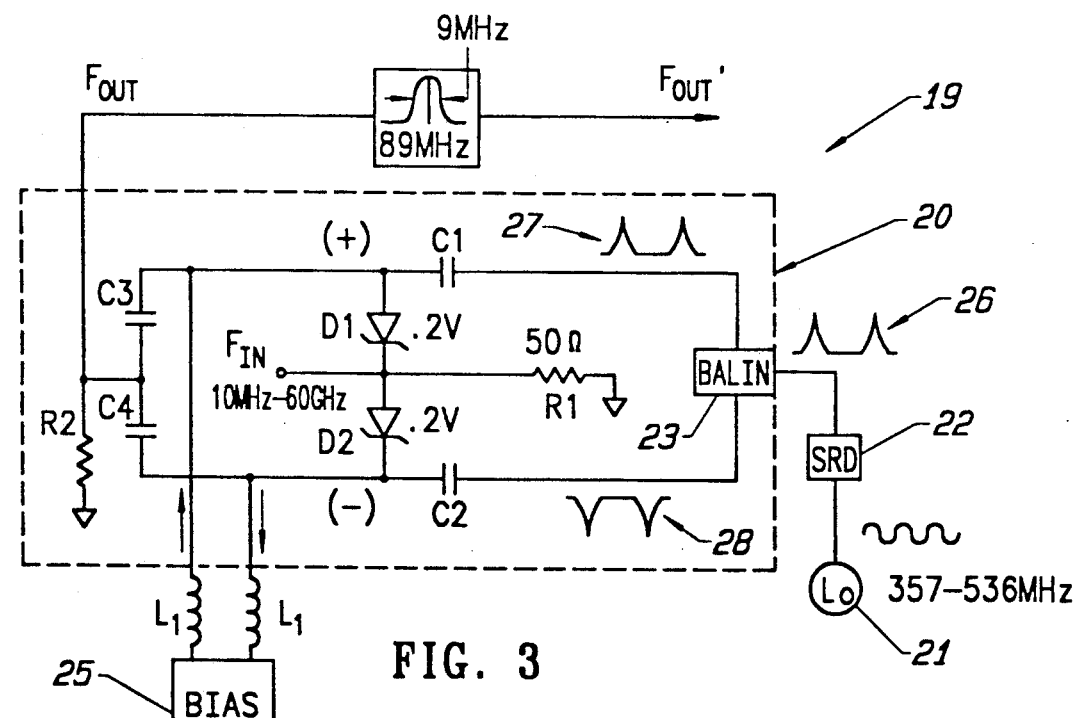
FIG. 3 is a block diagram of a sampler frequency converter according to the present invention.

Referring to FIG. 3, there is provided in accordance with the present invention an improved sampler frequency converter designated generally as 19. In the converter 19 there is provided a sampling circuit 20, a local oscillator 21 and a step recovery diode (SRD) 22. The output of the SRD 22 is coupled to a balun transformer 23. A first output of the balun transformer 23 is coupled to a capacitor C1. A second output of the balun transformer 23 is coupled to a capacitor C2.

Coupled in series between the capacitors C1 and C2 there is provided a pair of sampler diodes D1 and D2. The anode of diode D1 is coupled to the capacitor C1. The cathode of diode D1 is coupled to the anode of diode D2 and the cathode of diode D2 is coupled to the capacitor C2. A node located between the cathode of the diode D1 and the anode of the diode D2 is coupled to a source of input signals $S_{IN}$ having a frequency $F_{IN}$ and to ground by means of a resistor R1 of approximately 50 ohms. The diodes D1 and D2 typically have a threshold voltage of about 0.2 volts. Coupled in parallel across the diodes D1 and D2 there is provided a pair of capacitors C3 and C4. A node located between the capacitors C3 and C4 is coupled to ground through a resistor R2 and to the input of a bandpass filter 24. The signal at the node between the capacitors C3 and C4 comprises the output signal $S_{OUT}$ of the sampler having a frequency $F_{OUT}$. The bandpass filter 24 comprises a center frequency of 89 MHz and has a bandwidth of approximately 9 MHz. Coupled across the diodes D1 and D2 by means of a pair of chokes L there is provided a bias circuit 25 for forward biasing the diodes D1 and D2. as will be further described below.

In operation, an input signal $S_{IN}$ having a frequency $F_{IN}$ within the range of 10 MHz to 60 GHz is applied to the node between the diodes D1 and D2. The local oscillator 21 provides an output having a frequency within the range of 357 MHz to 536 MHz. As is well known in VNA sampler circuits, the frequency of the oscillator 21 is change or stepped with the frequency of the input signal $F_{IN}$ applied to the node between the diodes D1 and D2 so as to maintain the output of the filter 24 at a frequency $F_{OUT}$ of 89 MHz.

The output of the oscillator 21 is used by the SRD 22 for generating a pulse train 26 of sample pulses having a pulse repetition rate equal to the frequency of the oscillator 21. The balun transformer 23 converts the pulse train 26 to a positive pulse train of sample pulses 27 and a negative pulse train of sample pulses 28. The pulses 27 and 28 are fed through the capacitors C1 and C2 to the diodes D1 and D2. respectively.

Figure 4:
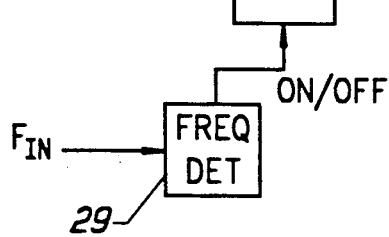
FIG. 4 is a composite of the sampling pulses applied to the diodes of the apparatus of FIG. 3.

Referring to FIG. 4, if the pulses 27 and 28 have a combined amplitude exceeding the threshold voltage of the diodes D1 and D2 as shown, the diodes D1 and D2 will be forward biased during the period that the amplitude of the pulses 27 and 28 exceed the combined diode threshold voltage, e.g. 0.4 volts. With the diodes D1 and D2 forward biased, the input signal $S_{IN}$ having the frequency $F_{IN}$ is sampled providing an output signal $S_{OUT}$ having the frequency $F_{OUT}$ at the node between the capacitors C3 and C4.

Figure 5:
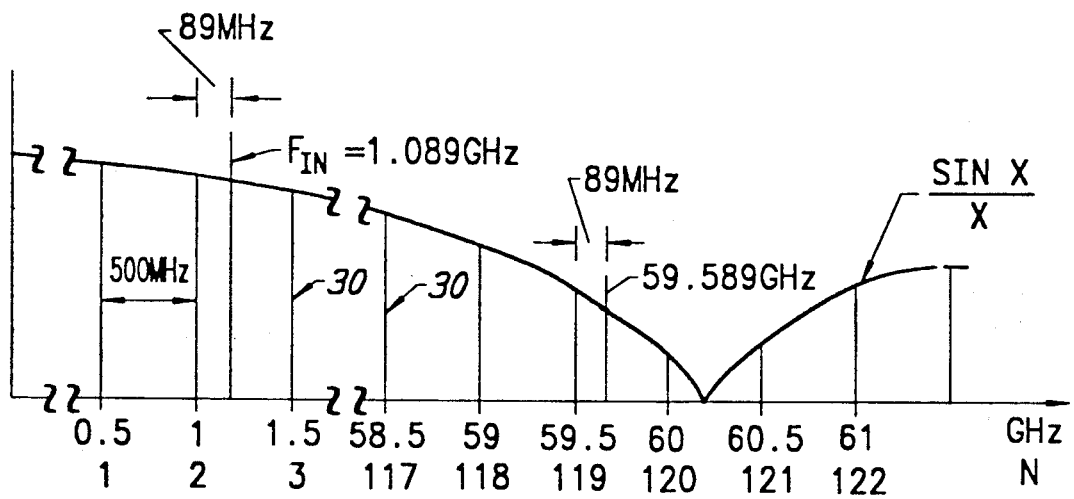
FIG. 5 is a diagram of the sampling pulses in the frequency domain which are applied to the diodes of FIG. 3.

A Fourier analysis of the pulses 27 and 28 applied across the diodes D1 and D2 show that in the time domain the pulses comprise a plurality of uniformly spaced spectral lines 30 as shown in FIG. 5. The spectral lines 30 are separated by a frequency corresponding to the pulse repetition rate of the output of the SRD 22. For example, if the pulse repetition rate of the SRD 22 is 500 MHz, the spectral lines 30 have a uniform 500 MHz spacing. This, in response to the input signal $S_{IN}$, will produce an output signal $S_{OUT}$ at the node between capacitors C3 and C4 having a frequency $F_{OUT}$ defined by the equation $$F_{OUT} = F_{IN} \pm N \cdot F_{LO}$$

From $S_{OUT}$ the bandpass filter 24 produces an output signal having a frequency $F_{OUT}'$ which is centered at the center frequency of the filter 24. As shown in FIG. 5, if the input signal $S_{IN}$ has a frequency $F_{IN}$ equal to 1.089 GHz, the input signal will mix with the second harmonic of the pulse trains 27 and 28 producing an output signal at the output of the filter 24 having a frequency $F_{OUT}'$ of 89 MHz. Similarly, if the frequency $F_{IN}$ of the input signal $S_{IN}$ is 59.589 GHz, the input signal $S_{IN}$ will mix with the 119th harmonic of the pulse trains 27 and 28 to produce an output signal at the output of the filter 24 having a frequency $F_{OUT}'$ of 89 MHz. However, as previously described, as the frequency of the input signal increases, the amplitude of the output signal $S_{OUT}$ changes and generally decreases as a function of (sin x)/x where $x = F_{IN}$ such that at a frequency $F_{IN}$ of approximately 50 GHz, the amplitude of the output signal $S_{OUT}$ is undesirably low.

As described above, the high frequency sensitivity response of the prior known sampler frequency converters was improved by reducing the duty cycle of the sampling circuit, that is, by reducing the period of the pulses used for controlling the sampling switch. In contrast, the high frequency response of a sampler frequency converter according to the present invention is achieved by forward biasing the diodes D1 and D2 so as to increase the duty cycle of the sampling. This is done by applying a bias to the diodes D1 and D2 which forward biases them at a predetermined input signal frequency $F_{IN}$. The frequency $F_{IN}$ at which the bias is applied is that frequency at which the amplitude of the higher lobe of the (sin x)/x response is equal to or greater than the amplitude of the first lobe, as will be further described below.

Figure 6:
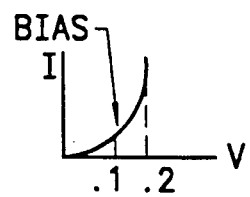
FIG. 6 is a diagram of the current-voltage curve of the diodes of the apparatus of FIG. 3.

As indicated above, diodes D1 and D2 have a threshold voltage $V_{th}$ of, for example, 0.2 volts. By applying a forward bias to the diodes D1 and D2 by means of the bias circuit 25, sufficient current is applied to the diodes D1 and D2 such that they are operating in the knee of the current-voltage curve, as shown in FIG. 6. This has the effect of increasing the effective period of the sampling pulses 27 and 28 from that of a narrow pulse as shown in FIG. 7 to that of a wider pulse as shown in FIG. 8. The net effect of applying the bias is to move the (sin x)/x nulls to a lower frequency as shown in FIG. 9.

Referring to FIG. 9, there is shown a pair of curves 40 and 41. Curve 40, which is represented by a solid line, represents the (sin x)/x response of the sampler 20 as a function of input frequency $F_{IN}$ when the diodes D1 and D2 are not biased. Curve 41 (broken line) shows the response, i.e. amplitude of the output $F_{OUT}$ when the diodes D1 and D2 are biased. As can be seen from FIG. 9, nulls 43 and 44 of the curve 40 are shifted down in frequency when the bias is applied as shown at 43' and 44', respectively.

Figure 10:
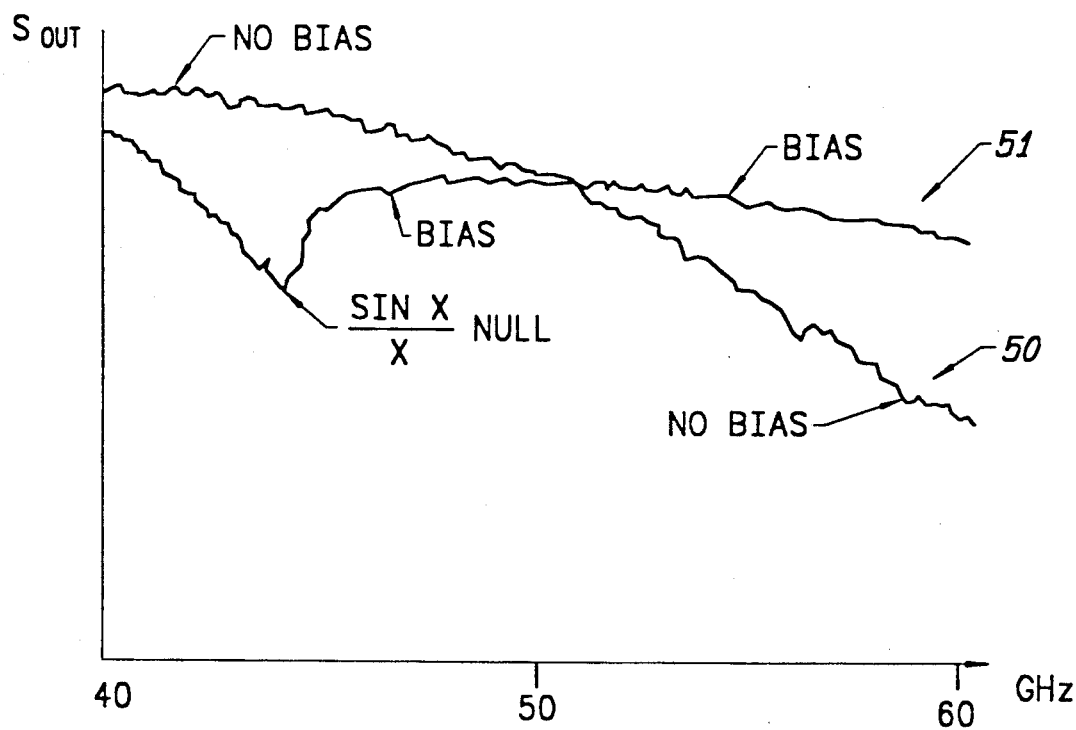
FIG. 10 is a diagram showing the output of the sampler frequency converter of FIG. 3 before and after bias is applied.
Figure 11:
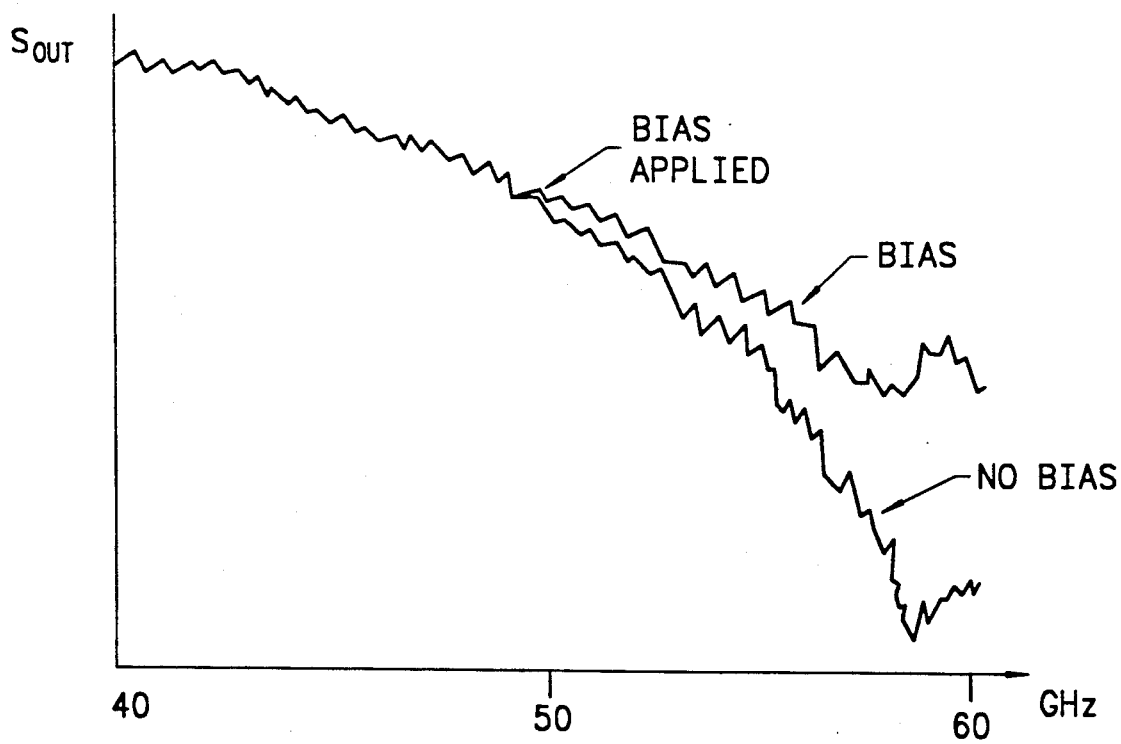
FIG. 11 is another diagram of the output of the sampler frequency converter before and after bias is applied.

Referring to FIG. 10, there is shown a pair of curves 50 and 51. Curve 50 represents the amplitude of the output $S_{OUT}$ versus frequency when the diodes D1 and D2 are not forward biased. Curve 51 shows the amplitude of the output $S_{OUT}$ when the diodes D1 and D2 are forward biased according to the present invention. As seen from FIG. 10, when the diodes D1 and D2 are forward biased by the bias circuit 25, the amplitude of the output signal $S_{OUT}$ is lower than without bias from 40 GHz to 50 GHz with a (sin x)/x null occurring at approximately 44 GHz. Beyond 50 GHz, however, the amplitude of the output signal $F_{OUT}$ is higher with bias than without bias. It follows therefrom that if the bias is applied when the input signal has a frequency $F_{IN}$ of about 50 GHz, a greater frequency response above 50 GHz will be achieved while retaining the frequency response achieved without bias below 50 GHz. Thus, by selectively applying bias as a function of receiver input frequency, sensitivity at high frequencies can be improved without degrading low frequency sensitivity, as shown in FIG. 11.

In practice, a control signal is provided to the bias circuit 25 for switching the bias applied to the diodes D1 and D2 on and off by a frequency detector 29 in response to the frequency $F_{IN}$ of the input signal $S_{IN}$ as shown in FIG. 3. Thus, when the frequency $F_{IN}$ is above a predetermined value, e.g. 50 GHz, the detector 29 causes the bias circuit 25 to apply forward bias to the diodes D1 and D2 and when the frequency is below 50 GHz the detector 29 causes the bias circuit 25 to remove the forward bias from the diodes D1 and D2. The actual frequency at which the bias is switched on or off is initially determined at the time the circuit 20 is made by observing the amplitude of the output signal $S_{OUT}$ with and without bias and is typically a fixed frequency for any given circuit.

Alternatively, the detector 29 could be replaced by a detector responsive to the amplitude of the output signal $S_{OUT}$ for causing the bias circuit 25 to apply forward bias to the diodes D1 and D2 when the amplitude of $S_{OUT}$ is higher with the forward bias than without the forward bias. Such a circuit, for example, would periodically check the amplitude of the output $S_{OUT}$ with and without forward bias to determined when the forward bias should be applied and removed.

Figure 12:
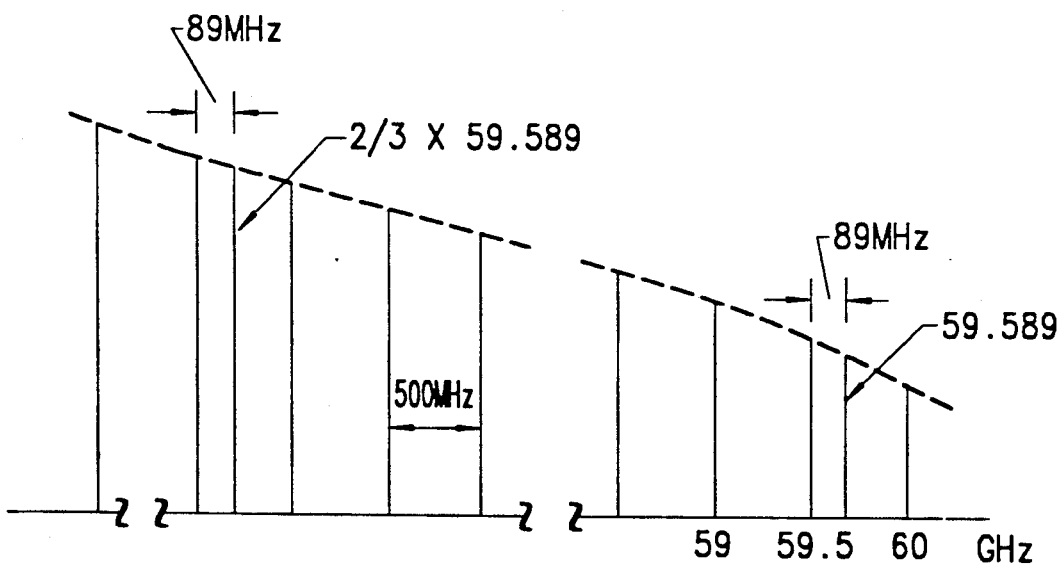
FIG. 12 is a diagram of the output of the apparatus of FIG. 3 in the frequency domain when the input signal is generated using frequency multipliers.

A secondary benefit of the method and apparatus of the present invention is that the new (sin x)/x nulls can be positioned to eliminate lower frequencies that might possibly cause spurious responses, i.e. false locking in a phase-locked loop which employs frequency multipliers for generating the frequency signals $F_{IN}$. For example, referring to FIG. 12, if the fundamental frequency $F_{IN}$ of the input signal $S_{IN}$ is 59.589 GHz and that signal is generated using a frequency tripler, there will exist sub-harmonics at ⅓ and ⅔ of that fundamental frequency which will mix with the spectral lines of the pulse trains 27 and 28 so as to produce multiple outputs $F_{OUT}'$ at 89 MHz.

In practice, such circuits generally involve a high pass filter having a frequency cutoff at 40 GHz which eliminates the lower ⅓ harmonic. The upper ⅔ harmonic, however, can still mix with the spectral lines of the pulse trains 27 and 28 and result in a spurious response. This is primarily due to the fact that the sampler sensitivity is higher at the frequency of the ⅔ sub-harmonic relative to the sampler response at the frequency of the fundamental. By means of the present invention, this false lock can be eliminated by moving the (sin x)/x response nulls down so as to place a null at the ⅔ sub-harmonic frequency. For example, with a fundamental frequency of 59.589 GHz the ⅔ sub-harmonic is located at 39.726 GHz. By moving the (sin x)/x null to locate the null at 39.726 GHz, the amplitude of the output will be sufficiently low relative to the amplitude of the output signal at 59.589 GHz that false locking will be eliminated.

While a preferred embodiment of the present invention is described above, it is contemplated that various modifications may be made thereto without departing from the spirit and scope of the present invention. Accordingly, it is intended that the embodiment described be considered only as an illustration of the present invention and that the scope thereof should not be limited thereto but be determined by reference to the claims hereinafter provided and their equivalents.

What is claimed is:

1. A sampler frequency converter having a first and a second diode, each of said diodes having an anode and a cathode, comprising:
means for applying an input signal having a frequency $F_{IN}$ to a node located between said cathode of said first diode and said anode of said second diode;
means for providing positive and negative pulses having identical pulse repetition rates $F_{LO}$ to said anode of said first diode and said cathode of said second diode, respectively;
means for coupling said anode of said first diode and said cathode of said second diode to a signal line so as to provide on said signal line an output signal having a frequency $F_{OUT}$ which is defined by the relationship $$F_{OUT} = F_{IN} \pm N \cdot F_{LO}$$

where N is an integer harmonic number, 1, 2, 3 ..., and an amplitude which varies as a function of (sin x)/x where $x = F_{IN}$;
means for filtering said output signal having said frequency $F_{OUT}$ so as to provide an output signal having a frequency $F_{OUT}'$ which comprises a predetermined band of frequencies; and
means for forward biasing said diodes when the frequency $F_{IN}$ of said input signal is above a predetermined frequency whereby the nulls which occur in said (sin x)/x relationship occur at a lower frequency after said biasing than before said biasing.

2. A sampler according to claim 1 wherein said positive and negative pulse providing means comprises:
means for providing a local oscillator signal having a frequency $F_{LO}$;
means for providing a pulse train comprising said pulse repetition rate $F_{LO}$; and
means for converting said pulse train into said positive and negative pulses.

3. A sampler according to claim 2 wherein said pulse train providing means comprises a step recovery diode means and said converting means comprises a balun transformer means.

4. A sampler according to claim 2 wherein said frequency $F_{LO}$ comprises a frequency within a predetermined range of frequencies and the highest frequency within said range of frequencies is approximately 1-½ times the lowest frequency within said range.

5. A sampler according to claim 4 wherein said range of frequencies is approximately 357 MHz to 536 MHz.

6. A sampler according to claim 1 wherein said filtering means comprises a bandpass filtering means having a center frequency and bandwidth of approximately 89 MHz, respectively.

7. A sampler frequency converter having a sensitivity response for providing an output signal having a frequency $F_{OUT}$ and an amplitude which varies as a function of (sin $F_{IN}$)/$F_{IN}$, where $F_{IN}$ is the frequency of an input signal applied thereto, comprising:
a local oscillator means having a frequency $F_{LO}$;
a step recovery diode means responsive to $F_{LO}$ for providing a pulse train having a pulse repetition rate $F_{LO}$;
a balun transformer means for converting said pulse train to a positive pulse train and a negative pulse train;
a first and a second sampler diode means, each of said diode means having an anode and a cathode;
capacitor means for coupling said positive pulse train to said anode of said first sampler diode means and said negative pulse train to said cathode of said second sampler diode means;
means for providing said input signal having said frequency $F_{IN}$ to a node located between said cathode of said first sampler diode means and said anode of said second sampler diode means;
a bandpass filter means;
capacitor means for coupling said anode of said first sampler diode means and said cathode of said second sampler diode means to said bandpass filter means; and
means for forward biasing said first and said second sampler diode means when said frequency $F_{IN}$ is above a predetermined frequency such that sharp decreases in the amplitude of said output signal which occur as the frequency $F_{IN}$ of said input signal is changed occur at a lower frequency $F_{IN}$ of said input signal after said diodes are biased than before said diodes are biased.

8. A sampler according to claim 7 wherein said frequency $F_{LO}$ is in the range of 357 MHz to 536 MHz, said frequency $F_{IN}$ is in the range of 10 MHz to 60 GHz, the center frequency of said filter means is about 89 MHz and the bandwidth of said filter means is about 9 MHz.

9. A sampler frequency converter comprising:
means including a diode circuit means having a plurality of diodes for providing in response to an input signal $S_{IN}$ having a frequency $F_{IN}$ and sampling pulses an output signal $S_{OUT}$ having a frequency $F_{OUT}$ which is defined by the relationship $$F_{OUT} = F_{IN} \pm N \cdot F_{LO}$$

and an amplitude which varies as a function of (sin x)/x where $x = F_{IN}$; and
means for forward biasing said diodes when the frequency $F_{IN}$ of said input signal is above a predetermined frequency whereby the nulls which occur in said (sin x)/x relationship occur at a lower frequency after said biasing than before said biasing to thereby increase the sensitivity of said sampler frequency converter at frequencies above said predetermined frequency.

10. A sampler frequency converter comprising:
means including a diode circuit means having a plurality of diodes for sampling an input signal $S_{IN}$ having a frequency $F_{IN}$ for providing an output signal $S_{OUT}$ having a frequency $F_{OUT}$ which is defined by the relationship $$F_{OUT} = F_{IN} \pm N \cdot F_{LO}$$

and an amplitude which varies as a function of (sin x)/x where $x = F_{IN}$, said sampling means having a sampling period; and
means responsive to said frequency $F_{IN}$ of said input signal $S_{IN}$ for increasing said sampling period when said frequency $F_{IN}$ of said input signal $S_{IN}$ is above a predetermined frequency.

11. A sampler frequency converter according to claim 10 wherein said means for increasing said sampling period comprises means for forward biasing said diodes when said frequency $F_{IN}$ of said input signal $S_{IN}$ is above said predetermined frequency.

12. A sampler frequency converter according to claim 10 wherein said frequency $F_{IN}$ comprises a frequency within a range of frequencies of approximately 357 MHz to 536 MHz.

13. A method of increasing the high frequency sensitivity response of a sampler frequency converter having a diode circuit means including a plurality of diodes responsive to an input signal $S_{IN}$ having a frequency $F_{IN}$ for providing an output signal $S_{OUT}$ having a frequency $F_{OUT}$ which is defined by the relationship $F_{OUT} = |F_{IN} \pm N \times F_{LO}|$ and an amplitude which varies as a function of (sin x)/x wherein $x = F_{IN}$, comprising the steps of:
sampling said input signal $S_{IN}$ during a sampling period, said sampling period having a first predetermined length when said frequency $F_{IN}$ of said input signal $S_{IN}$ is below a predetermined frequency; and
increasing said length of said sampling period to a second predetermined length when said frequency $F_{IN}$ of said input signal $S_{IN}$ is above said predetermined frequency.

14. A method of increasing the high frequency sensitivity response of a sampler frequency converter according to claim 13 wherein said step of increasing the length of said sampling period comprises the step of forward biasing said diodes.

* * * * *